(12) United States Patent
Lu et al.

(10) Patent No.: US 8,283,566 B2
(45) Date of Patent: Oct. 9, 2012

(54) PRINTED CIRCUIT BOARDS BY MASSIVE PARALLEL ASSEMBLY

(75) Inventors: JengPing Lu, Fremont, CA (US); Eugene M. Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 286 days.

(21) Appl. No.: 12/404,294

(22) Filed: Mar. 14, 2009

(65) Prior Publication Data

US 2010/0230139 A1 Sep. 16, 2010

(51) Int. Cl.
*H05K 1/00* (2006.01)
(52) U.S. Cl. ..................................................... 174/254
(58) Field of Classification Search ................... 174/254
See application file for complete search history.

(56) References Cited

U.S. PATENT DOCUMENTS

| | | | | |
|---|---|---|---|---|
| 3,447,249 A | | 6/1969 | Greger | |
| 3,870,850 A | * | 3/1975 | Larionov et al. | 219/85.15 |
| 4,542,397 A | * | 9/1985 | Biegelsen et al. | 257/723 |
| 4,668,333 A | * | 5/1987 | Tandon et al. | 438/67 |
| 4,990,462 A | * | 2/1991 | Sliwa, Jr. | 438/107 |
| 5,283,107 A | * | 2/1994 | Bayer et al. | 428/209 |
| 5,464,984 A | * | 11/1995 | Cox et al. | 250/370.11 |
| 5,742,086 A | * | 4/1998 | Rostoker et al. | 257/300 |
| 5,909,052 A | * | 6/1999 | Ohta et al. | 257/627 |
| 6,287,949 B1 | * | 9/2001 | Mori et al. | 438/612 |
| 6,369,445 B1 | * | 4/2002 | Khoury | 257/730 |
| 7,080,444 B1 | * | 7/2006 | Craig et al. | 29/740 |
| 2006/0128057 A1 | | 6/2006 | Lu | |
| 2006/0214173 A1 | * | 9/2006 | Beeson et al. | 257/88 |
| 2008/0144299 A1 | | 6/2008 | Redmond | |
| 2010/0170086 A1 | * | 7/2010 | Ramadan et al. | 29/834 |

* cited by examiner

*Primary Examiner* — Timothy Thompson
*Assistant Examiner* — Nathan Milakovich
(74) *Attorney, Agent, or Firm* — Marger Johnson & McCollom, P.C.

(57) ABSTRACT

A method of forming an interconnect substrate includes providing at least two unit cells, arranging the unit cells to form a desired circuit pattern, and joining the unit cells to form the interconnect substrate having the desired circuit pattern. A circuit substrate, has a desired circuit pattern on a substrate, the substrate made up of at least two unit cells having conductive lines electrically connected together.

7 Claims, 6 Drawing Sheets

PRINTED CIRCUIT BOARDS BY MASSIVE PARALLEL ASSEMBLY

BACKGROUND

Printed circuits boards are generally the standard technology for forming complete electronic circuits by connecting different electronic components. Typically, batch processes of large numbers of boards produce the boards using photolithography steps. Circuits are formed of traces and laid down in layers, with vias and other interconnects connecting the various layers together.

This type of process has many difficulties in converting to a 'produce-by-demand' or custom manufacturing process. The reticles and patterns, as well as the photolithography equipment, are expensive and time-consuming to create and use. The process requires large manufacturing facilities. This all makes the typical large batch process more cost and time efficient.

Recently, Seiko Epson has demonstrated an ink jet printing process that results in an ultra-thin, multi-layer printed circuit board. Metal is printed in a nano-colloidal ink solution and then baked to remove the organic material. Insulators are also printed from solution. The ability to print multi-layer circuit boards has been demonstrated. Significant advantages exist in this process, including the ability to print a different circuit board every run, essentially production by demand with little or no change over or retooling costs.

Some limitations of the ink jet process include that the metal and insulator material must be able to be solution-processed. This constrains the materials set that one can use to print these boards. Typically, insulators that can be solution-processed have lower performance values than solid insulators. The same is true of solution-processed metals. They generally result in lower density lines, which may impact performance in connectivity and reliability.

DETAILED DESCRIPTION OF THE EMBODIMENTS

Figure 1:
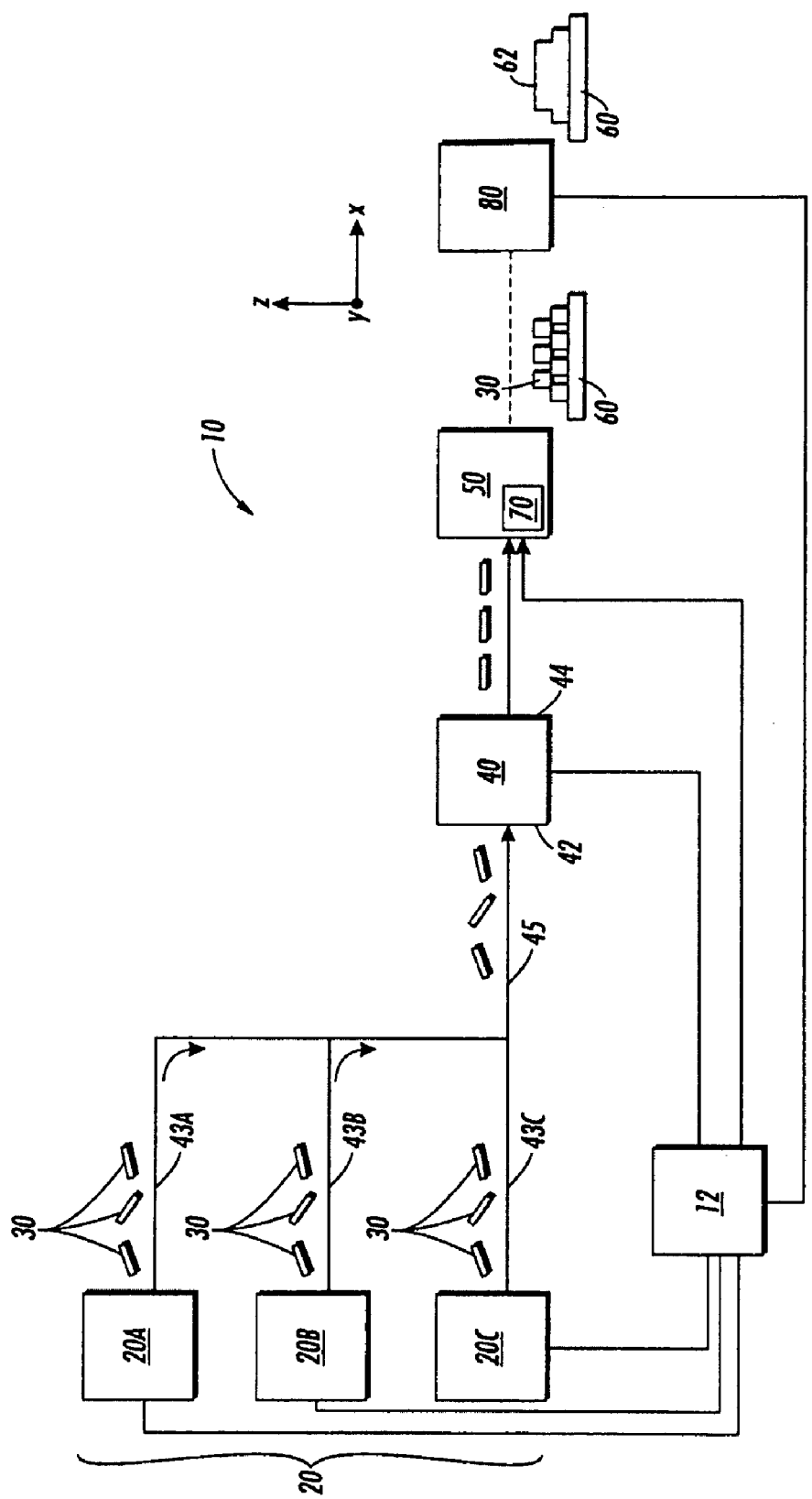
FIG. 1 shows an embodiment of a system to assembly an interconnect substrate.

FIG. 1 shows a system 10 for assembling an interconnect substrate. As used here, the term interconnect substrate means any substrate that provides interconnection among electrical or electronic components. Examples include printed circuit boards having one or more layers, ceramic substrates, flex circuitry, back planes, etc.

The system 10 of FIG. 1 is similar to that disclosed in U.S. Pat. No. 7,332,361, issued Feb. 10, 2008, owned by the assignee of this application and incorporated by reference herein. In that system, the system was used to assembly micro-objects, micron-sized components, into micro-structures. The system of FIG. 1, however, is directed to assembling an interconnect substrate, similar to a printed circuit board.

In FIG. 1, components of the interconnect substrate 30 are arranged in pre-processing units 20A, 20B and 20C. These pre-processing units may manufacture the components of the interconnect substrate, or they may act as reservoirs holding previously manufactured and stored components. This discussion will refer to the interconnect substrate components as 'unit cells.' A unit cell is any type of component that can be assembled into the interconnect substrate. Examples include, but are not limited to, unit cells comprising solely insulators, unit cells comprising insulators having at least one conductive line on one side, unit cells comprising insulators having at least one conductive line on two different sides, unit cells comprising insulators having at least one conductive line that changes directions such as forming a corner, and unit cells having at least one via, in combination with conductive lines, or not.

The pre-processing units may manufacture the unit cells by standard techniques used to form conductive lines and vias on a substrate. The substrate may then be diced or cut and the resulting unit cells distributed into reservoirs within the pre-processing units. One difference may be in the material used as the insulator in the unit cells. This material may consist of a thermoplastic or partially cured plastic. The ability to cross-link the material to bond unit cells together is a useful property, so any material with that capability is possible. For ease of sorting and handling, the unit cells may all be of a similar or same size.

The pre-processing unit them provides unit cells to the sorting unit 40 via routes 43A-C that converge to route 45 and into input 42. The sorting unit 40 may manipulate electrical and magnetic fields to sort the unit cells and orient them as needed for proper alignment and positioning for the desired circuit pattern. As mentioned above, at least some of the unit cells may have conductive lines and/or vias on them. Those that consist of only insulator material will not need to be oriented, just placed appropriately.

Other alternatives to the assembly process of orienting and/or placing the unit cells may include programmable microchip assembly methods. These may include surface energy techniques, such as digitally addressed heaters, digitally address solder melting, laser addressed pick and place and micro-pick-place with adhesives, among other. The assembly method of placing the unit cells with or without orientation is not limited to any particular process shown here.

Once sorted and oriented the unit cells are transferred to an image transfer unit 50 through the output 44 of the sorting unit. This may be thought of as similar to a print engine, where the unit cells are the ink or toner dispensed by the image transfer system onto a platen or other platform 60. The image transfer unit may have an image writer unit 70, as will be discussed in more detail later. The image transfer unit 50 will have a desired circuit pattern or patterns for each layer of the interconnect substrate that it uses to dispense the unit cells.

Once dispensed into a desired circuit pattern onto the platen 60, the unit cells 30 are then processed by the post-processing unit 80. This may involve compressing the unit cells together in at least one dimension and sintering or otherwise heating them to cross link the insulator material. An example of compressing the unit cells together would be to take one unit cell with the conductive lines facing the conductive lines on another unit cell. The two cells would be pressed together and then heated to form good electrical connections.

There is no limitation to sintering to form the bond, however. Any process that forms a bond between the unit cells and ensures robust electrical connections where needed may be used. The resulting interconnect substrate 62 can then be taken from the platen 60 and further processed as needed to package the interconnect substrate.

The transfers of the unit cells from one to the other of the stages, as well as the operation of each stage, may be controlled by a central controller 12. The central controller may reside in a computer or workstation used to run the assembly apparatus. The controller may receive the layout of the desired interconnect substrate, such as through a Gerber file, and direct the various processing stages to create an interconnect substrate having the desired layout. Instead of the resulting interconnect substrate being a printed circuit board, the interconnect substrate would be constructed of unit cells.

Figure 2:
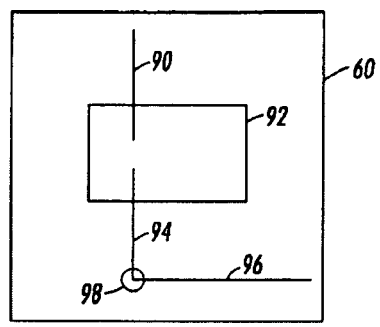
FIG. 2 shows an embodiment of a desired circuit design using unit cells.

Having seen an overview of a system to manufacture an interconnect substrate, it may prove useful to provide a specific example. FIG. 2 shows a top, schematic view of a desired circuit pattern. The portion of the interconnect substrate 60 shown has a first conductive line or trace 90. An active component, such as an integrated circuit chip (IC) 92 is positioned such that it makes contact with the conductive line 90. This contact may coincide with a pin or pad on the IC that is used to receive and send signals to other components on the interconnect substrate.

Similarly, another contact from the IC 92 may make contact with another conductive line 94. Again this may coincide with an input or output of the circuitry on the IC that is intended for other devices on the interconnect substrate 60. As can be seen here, in this particular example, the conductive trace 94 connects to the trace 96. From this view this appears to be 'flat' or that the same metal path forms the lines 94 and 96. However, the 'corner' 98 is actually accomplished by a conductive via, as the lines 94 and 96 are on different layers of the interconnect substrate. This circuit design is simplistic and is merely an example. Many different variations, having differing levels of complexity, are possible and no limitation should be implied from the examples given here.

Figure 3:
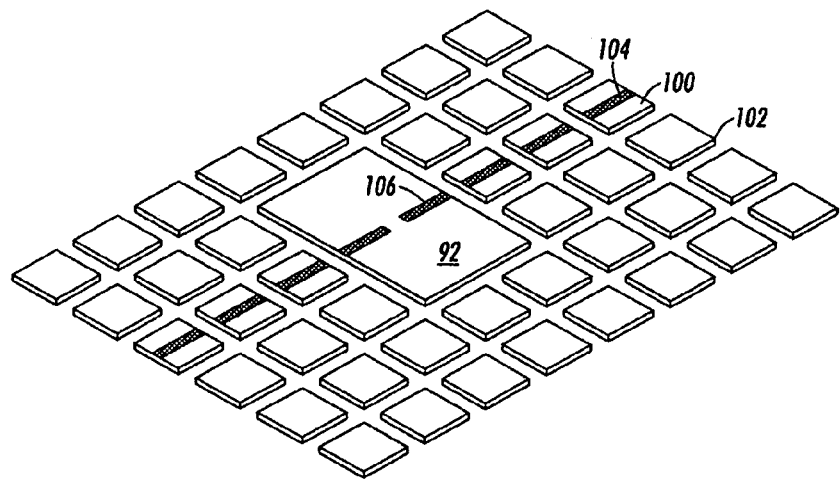
FIGS. 3-5 show an embodiment of manufacturing a completed interconnect substrate having a desired circuit design.
Figure 4:
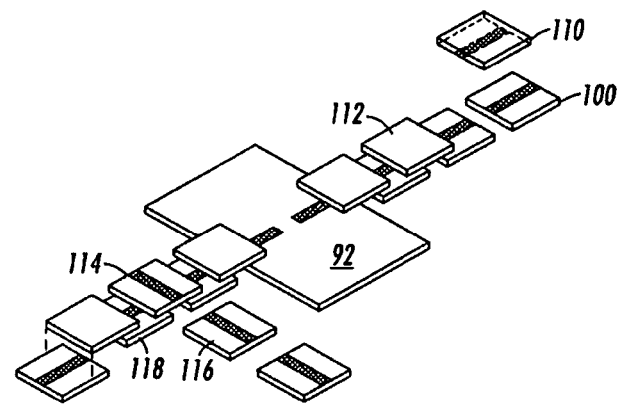
Figure 5:
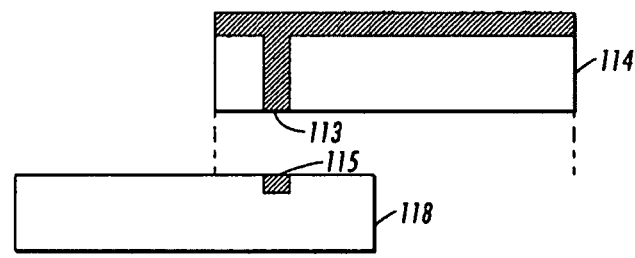

FIG. 3-5 show a manufacturing process to produce an interconnect substrate. FIG. 3 shows a first layer of the interconnect substrate. In this example, the first layer consists of the integrated circuit 92, typically 'flip chipped' with the pad for connection 106 pointing up relative to the drawing, and an arrangement of unit cells. In this instance, in order to implement the desired circuit pattern of FIG. 2, the unit cells are of one of two types. One type of unit cell is an insulator-only unit cell, such as 102. The other type of unit cell such as 100 consists of an insulator base having a conductive line 104 across one surface of it.

The unit cells such as 100 are arranged such that their conductive lines form a line that continues across their surfaces to the surfaced of the IC 92, and aligns with the traces 106 on the IC. This would correspond to the trace 90 of FIG. 2. The line formed on the near side of the IC across the surface of the unit cells would correspond to the line 96.

Once the first layer of the design is arranged, a second layer is formed. FIG. 4 shows the formation of this layer. Some of the insulator unit cells have been removed for simplicity. The second layer has unit cells with conductive lines on their bottom surfaces, to mate with the conductive lines on the top surfaces of the unit cells such as 100. Unit cell 110 is shown transparently to show the bottom side conductive line, with unit cell 112 showing the non-transparent view. The unit cells in the second layer are aligned over the unit cells of the first layer. They may be offset by a distance equal to half the width of a unit cell to allow better connectivity in the final conductive path.

On the near side of the figure, one can see that there is a unit cell 114 that has a conductive line across its top surface oriented in the drawing from left to right, instead of front to back as the other unit cells have their conductive lines, such as 100. This unit cell forms the connection at region 98 of FIG. 2. Unit cell 114 connects through this via to the unit cell 118, having a front-to-back conductive path, and then to unit cell 116 that has a left-to-right conductive path such as that shown on the top of unit cell 114. This is shown in cross-section form in FIG. 5.

The unit cell 114 has a via 113 that connects the conductive path on the top of 114 seen in FIG. 4 to the conductive path on the top of unit cell 118. When connected to unit cell 116, this allows the line 94 of FIG. 2 to connect to line 96 that resides in a different layer. The unit cells such as 116 then form the base of the conductive line 96.

Figure 6:
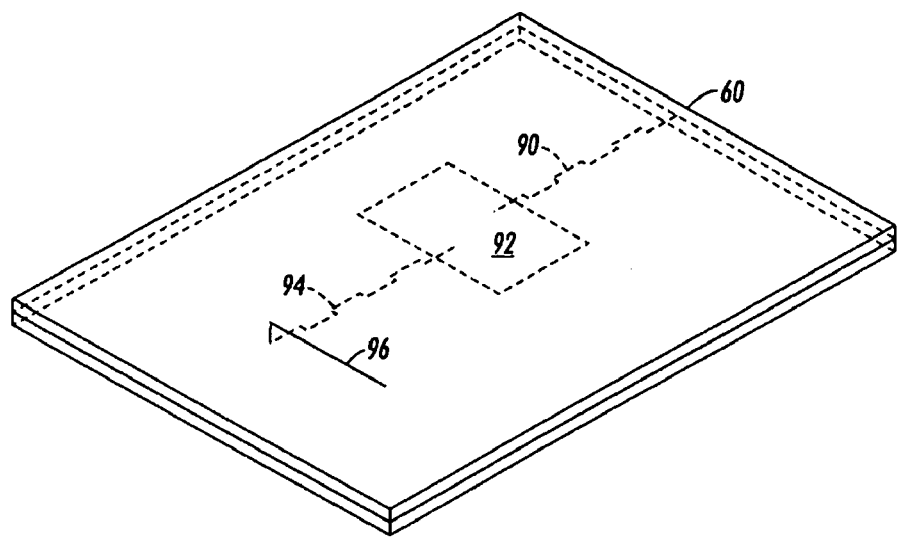
FIG. 6 shows an embodiment of an image writer to dispense the unit cells.

FIG. 6 shows an example of a resulting interconnect substrate. The IC 92 is either buried between the two layers, or on the bottom surface of the first layer. The lines 90 and 94 are in the interior of the layers, as well, so these structures are shown in dotted lines. The line 96 is on the surface of the top layer of the interconnect substrate. As can be seen here, the lines 90 and 94 have an interleaved type of appearance, due to the positioning of the second layer of unit cells in a bridging configuration.

Figure 7:
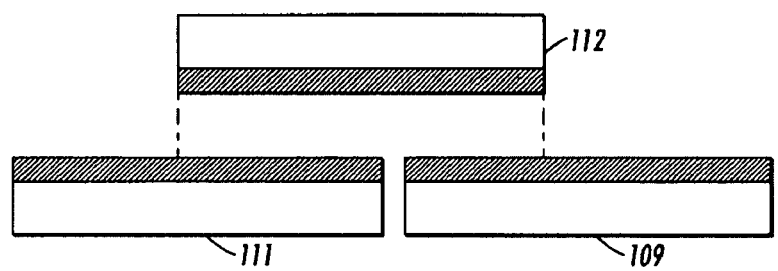
FIG. 7 shows an embodiment of a bridging configuration of the unit cells.

A cross-sectional view of a bridging configuration is shown in FIG. 7. The unit cells 111 and 109 from FIG. 4 that contribute to the formation of line 90 in FIG. 6 are shown in side view in FIG. 7. The bottom of unit cell 112 has a conductive path that is matched up with the conductive paths on the tops of unit cells 111 and 109. When pressed together, and then possibly fused, these conductive paths form the path shown as 90 in FIG. 6.

Figure 8:
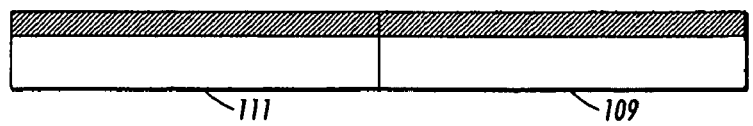
FIG. 8 shows an embodiment of a connective path without a bridging configuration.

It must be understood that only the first two layers are shown. Many more layers may be created using these techniques. Further, while the unit cells in the second layer are shown in a bridging configuration over the conductive lines in the first layer, this may not be necessary. The edges of the unit cells may form a strong enough connective path that this would not be necessary. FIG. 8 shows an example of this.

In FIG. 8, the unit cells 111 and 109 from FIG. 4 are shown as being fused together in a side-by-side, flat configuration. This may result from a shrinkable substrate, a temporary or permanent surface upon which the unit cells are mounted in a flat tile form. The unit cells could then be fused together sideways by heating/shrinking the unit cells, or the substrate upon which they reside. Maintenance of vertical planarity while shrinking may require the use of some sort of roller or other downward pressure to make sure that the unit cells do not warp or heave upwards at the joints between them. An alternative would be to have the unit cells manufactured from some sort of expandable polymer that expands upon heating such that the cells come into firm contact with each other, allowing formation of the solid conductive lines.

Once the desired circuit design for the interconnect substrate is completed, it is fused together into a finished interconnect substrate. Finished as used here means that it is bonded together and has become a unified substrate, not that no additional processing is needed. The interconnect substrate may undergo much further processing once completed here, including having other components such as connectors and other ICs mounted to it, etc.

As alternatives to fusing or sintering, both of which may involve high temperatures that may be incompatible with maintaining planarity or avoiding distortion of the unit cells and the resulting circuit, other processes may be used to join the unit cells into the unified substrate.

Referring to FIG. 3, the unit cells could be mounted similarly as those shown but touching and then placed in an electroless, or autocatalytic, metal plating bath. The metal would then be deposited on all of the exposed metal, making it thicker and connecting neighboring chips. This may provide a low-temperature, non-distorting approach. One possible issue is that it may only apply to 1 or 2 layer boards. More layers may result in the lower layers being screened from the plating bath preventing those layers from receiving enough metal to ensure a solid connection.

Other approaches may include self-assembly of the conductive lines between the unit cells. By manipulating the surface energy of the conductive lines, the unit cells could be dipped into a fluid containing conductive particles similar to silver particle solutions used in inkjet printing conductive lines and the metal would adhere to the metal surfaces due to the surface energy. Other versions of self-assembly may include using electrostatic or magnetic forces acting on the conductive lines to attract dry conductive particles, similar to conductive toner. These versions may include an annealing process to form a solid connection.

The conductive solution used in the dip coating could also be used to print conductive particles between the conductive lines on the unit cells. During assembly, the print head could dispense particles along the conductive lines based upon the alignment of the unit cells. It may also be adapted to correct for misaligned unit cells to make the connections.

The bonding may involve fusing and sintering, or any other process that serves to cross link the insulator base of the unit cells together as well as form the solid connections between the various conductive paths. The conductive lines may be formed of low temperature sinterable materials, such as certain metals, solder paste, etc.

The materials selection will have an impact on the final bonding process. If thermoplastic or other lower temperature insulator is used, the conductive material must be a lower temperature material. Otherwise the conductive lines on the top of the unit cells will not bond with the conductive lines on the bottom of the unit cells. This does not preclude the use of metal, metal is also a possibility depending upon the insulator selection. The exact selection and combination of materials will be up to the substrate and circuit designer.

In this manner, it is possible to 'produce-by-demand' interconnect substrates. It must be noted that any circuit topology may be manufactured using this technology. If one were to look at any standard PCB design, it is possible to achieve that same design with the same number of layers using the techniques described here. The process can produce any circuit topology with any number of layers.

Figure 9:
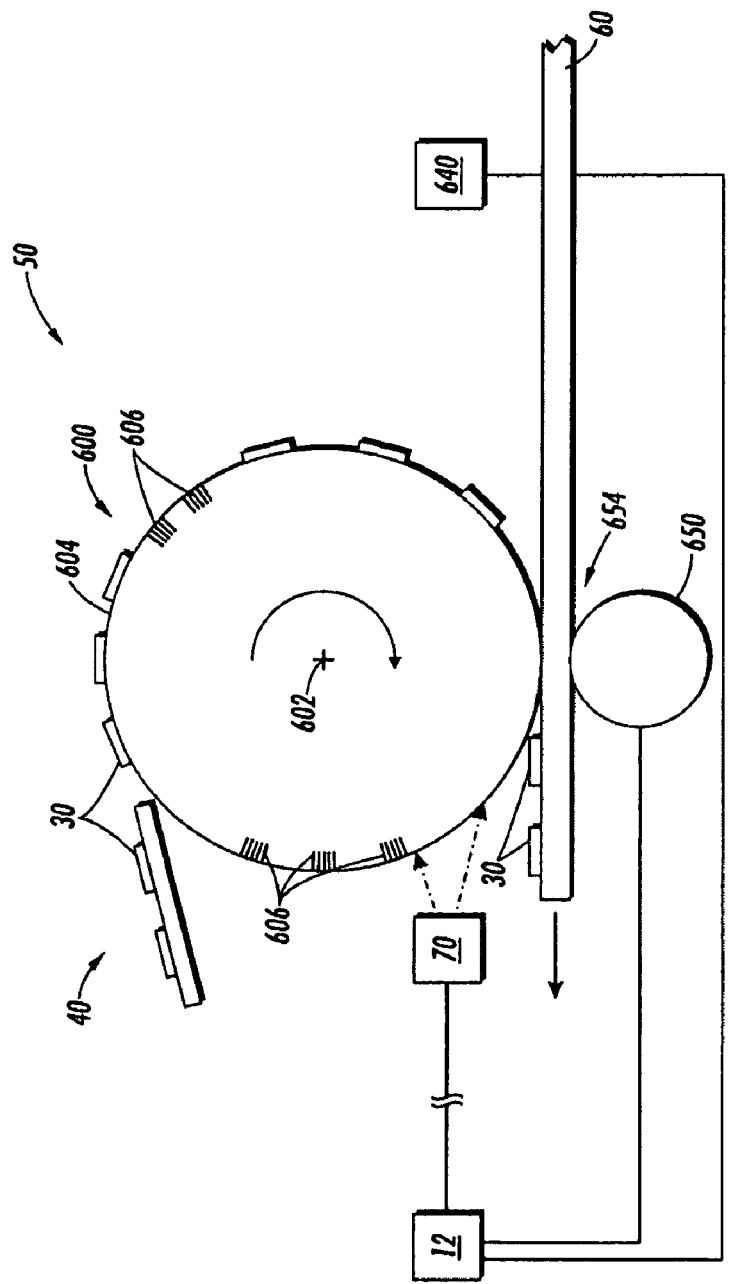
FIG. 9 shows a system to dispense unit cells as particles.

Using the unit cells in an image writer such as 70, it is possible to dispense the unit cells as if they were ink or toner particles. In the example of FIG. 9, the unit cells 30 are dispensed by the sorting unit 40 onto an image transfer drum 600 in the image transfer unit 50. The drum 600 rotates about the axis 602, and has a surface 604 that can support an electrostatic image 606. Image writer unit 70 may form the electrostatic image 606 on the surface 604 of the drum 600 under control of the controller 12. The electrostatic image may have varying charges that attract unit cells with different configurations dependent upon the charge. The electrostatic image 606 causes the unit cells 30 to stay attached to the drum 600 until they come into contact with the platen or platform 60. The drum 650 underneath the platform serves to apply pressure between the platform 60 and the drum 600 at nip 654 to cause the unit cells to transfer to the platen 60.

The use of a post-processing unit such as 80 may not be necessary as the combination of the pressurized nip and the heating process provided by the heating element 640 may provide sufficient pressure and temperature to solidify the interconnect substrate. The system of FIG. 9 does show how the unit cells could be dispensed as if they were toner particles in a dry toner.

One can also envision the unit cells being dispensed from solution as a liquid 'ink.' Other variations may include limiting the system to a particular set number of types of unit cells and dispensing them as if they were colors. This may work similar to a 4-color system, where each color is printed separately to form a final image. One could imaging that instead of colors, one could print unit cells of a particular type as one color, using the four different types to form the interconnect substrate.

Figure 10:
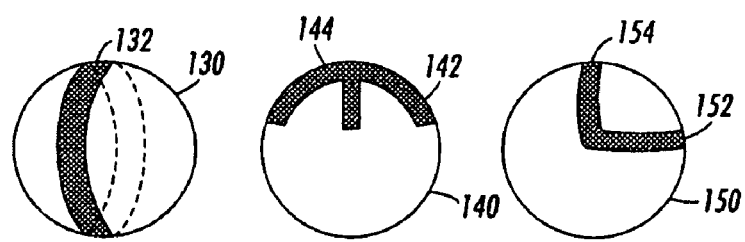
FIG. 10 shows embodiments of spherical unit cells.

In addition, whether dispensed as ink or otherwise, the unit cells may take many other shapes, including spherical, octagonal, cylindrical, pyramidal, etc. FIG. 10 shows an example of how various connective structures could be manufactured from spherical unit cells. A spherical unit cell 130 may have a band of conductive material 132 encompassing its entire girth in a 360 degree configuration. This would allow connection between adjacent unit cells on each side of the conductive band, as well as connect to unit cells above and below the unit cell. Alternative configurations include unit cells such as 140 having a band traversing partially around the sphere 142 in one direction and another band 144 traversing 90 degrees offset from the first. Similarly, the bands could 'turn corners' as discussed with regard to FIG. 4, with the band being deposited to have the corner integrated into it as shown by unit cell 150 having a conductive band 152 forming a corner with band 154.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A circuit substrate, comprising:
   a desired circuit pattern on a substrate, the substrate made up of at least two unit cells having conductive lines on a face of the unit cells, such that the conductive line on the face of one unit cell contacts electrically the conductive line on the face of the other unit cell;
   each unit cell being of a material bondable to the other unit cell, the material having the characteristic of fusing to the other unit cell when heated to form the substrate.

2. The circuit substrate of claim 1, the unit cells comprising an insulator having: conductive line on opposite faces of the cell; the conductive line having a change of direction; or the conductive line connected to a via.

3. The circuit substrate of claim 1, wherein the desired circuit pattern has multiple configurations of circuit topology.

4. The circuit substrate of claim 1, wherein the substrate has multiple layers.

5. The circuit substrate of claim 1, wherein the unit cells are in one of a bridging configuration or a side-by-side configuration.

6. A circuit substrate, comprising:
a desired circuit pattern on a substrate, the substrate made up of at least two unit cells having conductive lines on a face of the unit cells, such that the conductive line on the face of one unit cell contacts electrically the conductive line on the face of the other unit cell;
each unit cell being of a material bondable to the other unit cell, the material having the characteristic of expanding and coming into contact to the other unit cell when heated to form the substrate.

7. The circuit substrate of claim 1, wherein the unit cells comprise spheres.

* * * * *